United States Patent
Kelley et al.

(10) Patent No.: US 6,174,786 B1
(45) Date of Patent: Jan. 16, 2001

(54) SHALLOW TRENCH ISOLATION METHOD PROVIDING ROUNDED TOP TRENCH CORNERS

(75) Inventors: Patrick J. Kelley; Ranbir Singh; Larry B. Fritzinger; Cynthia C. Lee; John Simon Molloy, all of Orlando, FL (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/447,154

(22) Filed: Nov. 23, 1999

Related U.S. Application Data
(60) Provisional application No. 60/115,536, filed on Jan. 12, 1999.

(51) Int. Cl.[7] .................................................. H01L 21/76
(52) U.S. Cl. .......................... 438/425; 438/427; 438/429; 438/430; 438/433
(58) Field of Search .................................. 438/424, 427, 438/433, 425, 429, 430

(56) References Cited

U.S. PATENT DOCUMENTS

| | | | |
|---|---|---|---|
| 5,643,822 | * | 7/1997 | Furukawa et al. . |
| 5,674,775 | * | 10/1997 | Ho et al. . |
| 5,753,561 | * | 5/1998 | Lee et al. ............................ 438/424 |
| 5,801,083 | * | 9/1998 | Yu et al. ............................. 438/424 |
| 5,937,309 | * | 8/1999 | Chuang ............................... 438/424 |
| 5,958,629 | * | 9/1999 | Yan et al. ............................. 430/5 |
| 5,968,844 | * | 10/1999 | Keller ................................. 438/695 |
| 5,994,234 | * | 11/1999 | Ouchi ................................. 438/719 |
| 6,001,707 | * | 12/1999 | Lin et al. ............................ 438/433 |
| 6,025,249 | * | 2/2000 | Kuo .................................... 438/426 |

* cited by examiner

Primary Examiner—Long Pham

(57) ABSTRACT

A method of shallow trench isolation by forming a trench in a semiconductor device comprises the steps of forming an oxide layer; forming a mask layer; anisotropically etching the mask layer; forming a second oxide layer; forming a cap layer; forming rounded end caps adjacent the mask; and transferring the rounding of the caps to the top corners of the trench. The oxide layer is formed over a substrate of the semiconductor device. The mask layer is formed over the oxide layer. The mask layer is then anisotropically etched to form the mask and an opening in the mask. The opening in the mask exposes the substrate, and the width of the opening is greater than the width of the trench. Blanket etching the cap layer forms the rounded end caps. The rounded end caps are adjacent to the mask on opposite ends of the opening, and the distance between the end caps is about equal to the width of the trench. The trench is formed by plasma etching the trench. During this process, the rounding of the end caps is transferred to the top corners of a trench.

10 Claims, 2 Drawing Sheets

SHALLOW TRENCH ISOLATION METHOD PROVIDING ROUNDED TOP TRENCH CORNERS

CROSS-REFERENCE TO RELATED APPLICATION

The present application claims the benefit of Provisional Application No. 60/115,536 filed Jan. 12, 1999, which is incorporated herein by reference.

STATEMENT REGARDING FEDERALLY SPONSORED RESEARCH AND DEVELOPMENT

Not Applicable

FIELD OF THE INVENTION

This invention relates to the manufacturing of semiconductor devices. More specifically, the invention relates to providing an improved shallow trench isolation process.

BACKGROUND OF THE INVENTION

It is well known that adjacent devices, such as transistors, in metal oxide semiconductor (MOS) circuits need to be isolated. Several isolation techniques have been developed to accomplish this isolation and include localized oxidation isolation (LOCOS), poly buffered LOCOS, and shallow trench isolation. Although LOCOS is a commonly used technique, shallow trench isolation provides an improved ability to reduce the distance between transistors necessary to isolate the transistors. Therefore, shallow trench isolation advantageously allows for a greater density of transistors in a given area. During shallow trench isolation, trenches separating the transistors are formed into the silicon substrate and typically vary in depth between 0.3M and 0.8M. These trenches can be formed by many methods, but the trenches are commonly provided by anisotropically etching the substrate using dry etching. However, a problem associated with the method of shallow trench isolation is that the top corners of the trench provided by this method typically are sharp and have little rounding. A problem with sharp top trench corner having little rounding is that the corner provides an abrupt transition from the transistor active area to isolation. If a polysilicon gate wraps around into the isolation corner, a parasitic conduction path can occur in the sub-threshold regime. This causes the well-known and undesired "double hump" in the drain current to drain voltage (I–V) curve. One method of producing rounded top corners is by high temperature field oxidation. In this manner, the corner is rounded by growing a thin thermal oxide layer in the trench. However, the degree of rounding of the corners is difficult to control using this process.

SUMMARY OF THE INVENTION

It is an object of the invention to provide an improved shallow trench isolation method that provides rounding of top corners.

It is still another object of the invention is to provide an improved shallow trench isolation method that provides top corner rounding without the need of high temperature field oxidation.

These and other objects of the invention are achieved by the subject method which includes the steps of forming an oxide layer; forming a mask layer; anisotropically etching the mask layer; forming a second oxide layer; forming a spacer; forming rounded end caps adjacent the mask; and transferring the rounding of the caps to the top corners of the trench.

The oxide layer is formed over a substrate of the semiconductor device, and the mask layer is then formed over the oxide layer. The mask layer is anisotropically etched to form the mask and an opening in the mask. The opening in the mask exposes the substrate with the width of the opening preferably being greater than the width of the trench.

Blanket etching the spacer forms the rounded end caps. The rounded end caps are adjacent to the mask on opposite ends of the opening, and the distance between the end caps is about equal to the width of the trench. The trench is formed by plasma etching the trench. During this process, the rounding of the end caps is transferred to the top corners of a trench.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, the preferred methods and materials are described below.

BRIEF DESCRIPTION OF THE DRAWINGS

There are shown in the drawings embodiments of the invention that are presently preferred, it being understood, however, that the invention is not limited to the precise arrangements and instrumentalities shown.

DETAILED DESCRIPTION OF THE INVENTION

Figure 1:
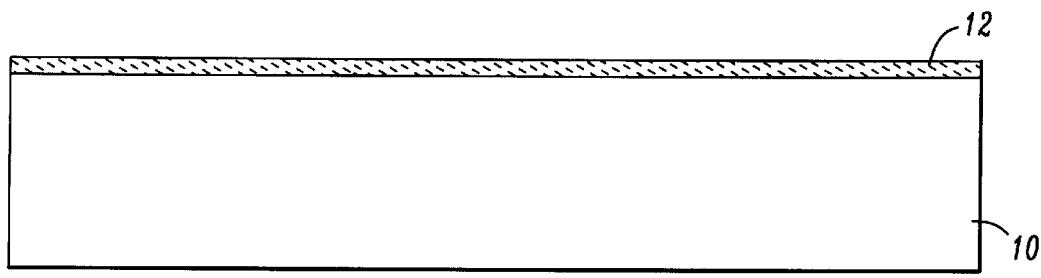
FIG. 1 is a cross-sectional view of a substrate after an oxide is formed over the substrate.

A method of shallow trench isolation providing rounded corners according to an embodiment of the invention is illustrated in FIGS. 1–6. As illustrated in FIG. 1, a pad oxide 12 is formed over the substrate 10. The pad oxide 12 reduces stress between the substrate 10 and a layer 14 (shown in FIG. 2) over the substrate 10.

Processes capable of forming a pad oxide 12 over a substrate 10 are well known in the art, and the invention is not limited as to any particular process of forming the pad oxide 12. A common method of forming a pad oxide 12 is to heat a substrate 10 formed from silicon in an oxygen atmosphere. The resulting reaction forms a $SiO_2$ layer that acts as the pad oxide 12. Although the pad oxide 12 is not limited as to a particular thickness, the presently preferred thickness of the pad oxide 12 is between about 100–400 Å. In a most preferred embodiment, the thickness of the pad oxide 12 is about 150 Å.

Figure 2:
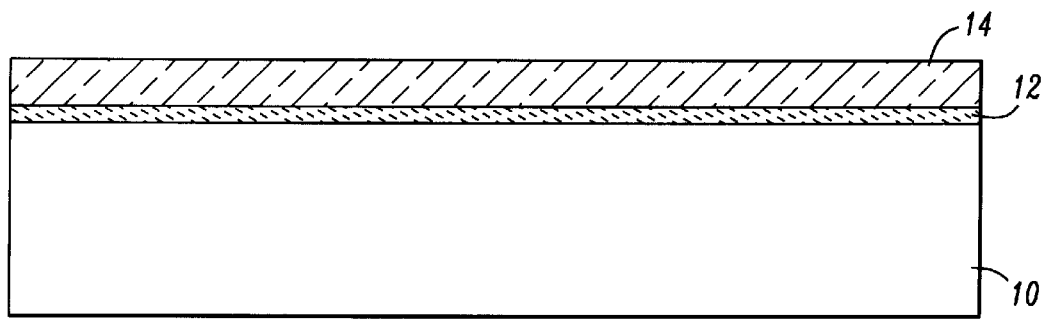
FIG. 2 shows the shallow trench isolation as illustrated in FIG. 1 after forming a mask layer over the oxide.

As illustrated in FIG. 2, a mask layer 14 is then formed over the pad oxide 12. The mask layer 14 is preferably formed from a material that can be selectively removed, for example silicon nitride (Si$_3$N$_4$), silicate glass, or phosphorus-doped silicon dioxide.

In a preferred embodiment, the mask layer 14 is formed from a boron phosphorus doped silicate glass. Although any process capable of forming a mask layer 14 of boron phosphorus doped silicate glass is acceptable for use with this invention, the presently preferred method of forming the mask uses tetraethoxysilane, Si(OC$_2$H$_5$)$_4$, abbreviated as TEOS, as a precursor material. The overall reaction is commonly written as:

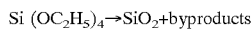

$$\text{Si (OC}_2\text{H}_5)_4 \rightarrow \text{SiO}_2 + \text{byproducts}$$

As is known by those skilled in the art, silicate glass is formed by decomposing the TEOS in a chemical vapor deposition (CVD) reactor at temperatures of about 650° C. to 750° C. In a preferred embodiment the TEOS film is formed by plasma enhanced chemical vapor deposition (PECVD).

Any method of doping the silicate glass with boron and phosphorus is acceptable for use in the invention. For example, phosphorus doping of silicate glass can be accomplished by adding phosphorus compounds, typically phosphine or trimethylphosphite, to the TEOS reaction. Doping of the silicate with boron is typically accomplished by adding diborane, boron trichloride, or trimethylborate to the TEOS reaction. In a preferred embodiment, the silicate glass is doped with boron and phosphorus using boron phosphorus tetraethoxysilane (BPTEOS) as a precursor material.

Figure 3:
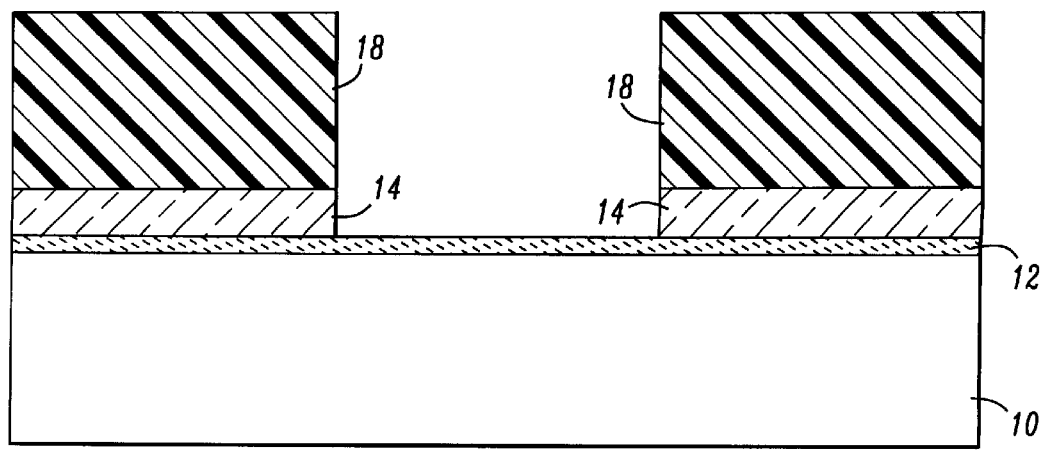
FIG. 3 shows the shallow trench isolation as illustrated in FIG. 2 after a photoresist is deposited over areas of the mask layer not to be removed and after a portion of the mask layer and oxide has been removed.

As illustrated in FIG. 3, once the mask layer 14 is formed, the mask layer 14 will be selectively etched to form a mask 14. Any method capable of forming a mask 14 is acceptable for use with this invention. However, the presently preferred method of forming a mask 14 is to deposit a resist 18 over the areas not to be etched, which includes the mask 14. After the resist 18 is applied, the unexposed mask layer 14 is anisotropically etched to remove any unexposed mask layer 14. Once the etching has been completed, the resist 18 is then removed. The resist 18 preferably covers a sufficient width of the mask layer 14 to leave a mask 14 having an opening that is slightly greater than the desired final width of the trench 24 (best shown in FIG. 6).

Figure 4:
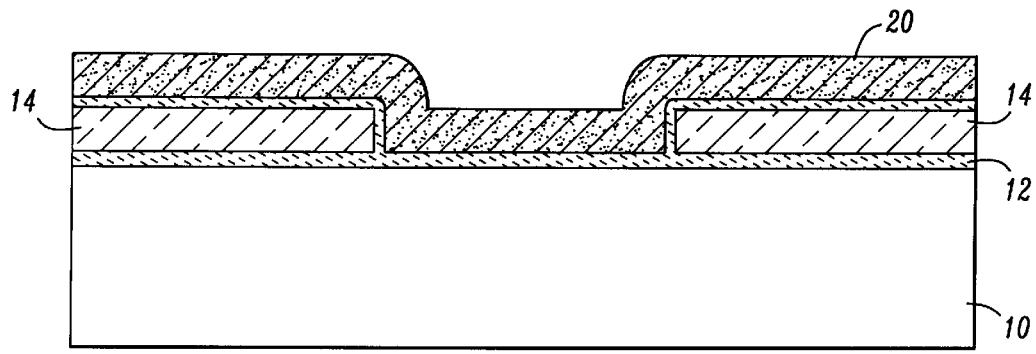
FIG. 4 shows the shallow trench isolation as illustrated in FIG. 3 after a spacer is formed over the mask and oxide.

As illustrated in FIG. 4, the oxide 12 over the substrate 10 is reformed and a cap layer 20 is formed over the mask 14 and the oxide 12. Processes capable of forming a cap layer 20 are well known in the art, and the invention is not limited as to a particular method. Illustrative examples of processes capable of forming the cap layer 20 include PECVD and LPCVD. However, the cap layer 20 is formed so as to have a greater thickness adjacent ends of the mask 14.

The cap layer 20 is not limited as to a particular material from which it can be formed. For example, the cap layer 20 can be formed from silicon nitride or silicon oxide. However, in a preferred embodiment, the cap layer 20 is formed from silicon nitride.

Figure 5:
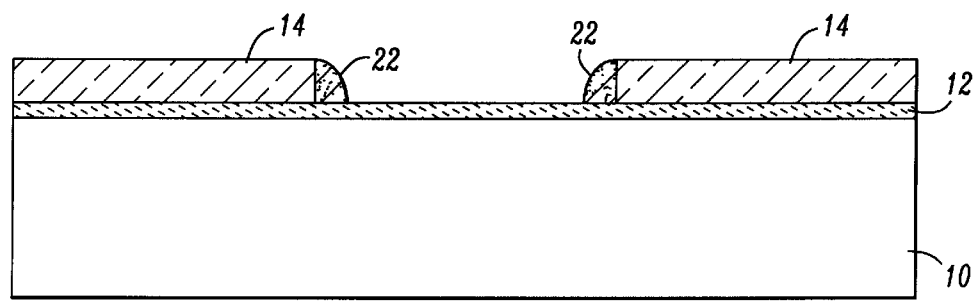
FIG. 5 shows the shallow trench isolation as illustrated in FIG. 4 after the spacer has been removed and rounded caps have been formed adjacent the mask.

As illustrated in FIG. 5, once the cap layer 20 has been formed, the cap layer 20 is etched to remove all the material of the cap layer 20 except for caps 22 having rounded corners on either side of the mask 14. Because the mask 14 was formed having an opening slightly greater than the desired final width of the trench 24, the additional width provided by the caps 24 narrows the width of the opening to that of about the desired width of the trench 24.

Any method of etching the cap layer 20 to form caps 22 having rounded corners is acceptable for use with this invention. However, the presently preferred etching process is a blanket anisotropic etch. The caps 22 remain because the cap layer 20 was deposited having a greater thickness adjacent the sides of the mask 14, and upon uniform removal of the cap layer 20, only the thickest material adjacent the sides of the mask 28 remains.

Figure 6:
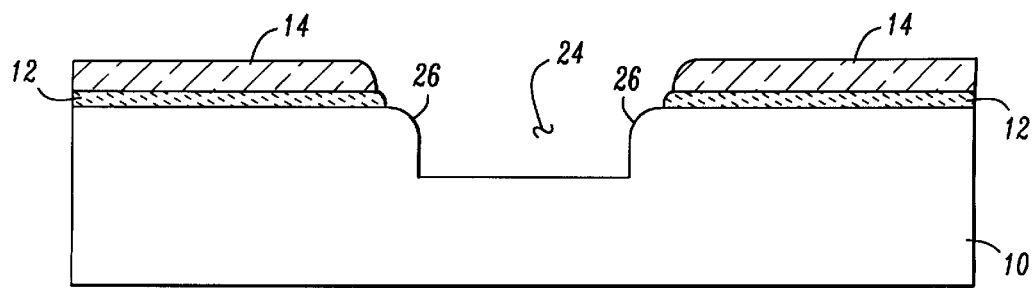
FIG. 6 shows the shallow trench isolation as illustrated in FIG. 5 after a trench having rounded top corners has been etched into the substrate.

As illustrated in FIG. 6, upon etching of the caps 22 and substrate 10, the rounding of the caps 22 are transferred to the top corners 26 of the trench 24. Rounding refers both to the radius of the corner and whether the radius is constant along the arc length of the curve. This transferring of the rounding from the caps 22 to the top corners 26 is not limited to an exact transfer. For example, the radius of the caps 22 may be greater or smaller than the radius transferred to the top corners 26 of the trench 24. Furthermore, only a portion of the arc length of the curvature may be transferred from the cap 22 to the top corner 26.

Although any method of transferring the rounding of the caps 22 to the top corners 26 is acceptable, the presently preferred method is a plasma etch. In this manner, as the cap 22 is reduced in size, the substrate 10 below the cap 22 is exposed and subsequently also reduced.

The degree of rounding of the corners of the trench 16 can be dependent on several factors. One factor is the initial rounding of the caps 22, as the degree of rounding of the caps 22 will determine the rounding of the top corners 26 of the trench 24.

Another factor is the etch selectivity. For example, if the material of the substrate 10 and the caps 22 are etched at about the same material removal rate, the rounding of the caps 22 will be transferred to the top corners 26. If the material of the cap 22 is removed at a smaller rate than the material of the substrate 10, then a smaller portion of the rounding will be transferred to the top corners 26. Likewise, if the material of the cap 22 is removed at a rate higher than the material of the substrate 10, a greater portion of the rounding will be transferred to the top corner 26.

It is noted that the thickness of the mask layer 14 is still another factor that can determine the degree of rounding of the corners 26. With all other factors being equal, as the thickness of the mask layer 14 increases, the degree of rounding decreases.

Once the substrate 10 has been etched, the mask 14 is preferably removed without damaging the substrate 10. Although any process of removing the mask 14 without damaging the properties of the substrate 10 is acceptable for use with the invention. In the presently preferred embodiment of the invention, in which a boron phosphorus doped silicate glass is the material of the mask 14, the mask 14 is preferably removed in a NH$_4$OH/H$_2$O$_2$ solution.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof for an indication of the scope of the invention.

What is claimed is:

1. A method of shallow trench isolation in a semiconductor device, comprising the steps of:
   forming an oxide layer over a substrate;
   forming a mask layer over the oxide layer;
   anisotropically etching the mask layer and leaving at least a portion of the oxide layer to form an opening in the mask, the opening exposing the oxide layer in the mask opening and the width of the opening greater than the width of a trench;

forming a cap layer in the opening over the mask opening;

blanket etching the cap layer in a first etch step to form rounded end caps adjacent the mask opening on opposite ends of the opening, the distance between the end caps about equal to the width of the trench, wherein the blanket etch does not etch the substrate;

plasma etching the substrate surface to form the trench in the substrate in a second etching step;

whereby the rounding of the end caps is transferred to the top corners of the trench, concurrent with the trench etching step.

2. A method of manufacturing a semiconductor device, comprising the steps of:

isolating adjacent transistors by interposing between one or more shallow trench isolation regions formed from trenches between the adjacent transistors, said trenches having rounded top corners, the isolating step including:

forming an oxide layer over a substrate;

forming a mask layer over the oxide layer;

forming a mask opening over the substrate in the semiconductor device, wherein at least a portion of the oxide layer remains in the mask opening;

forming rounded end caps adjacent the mask on opposite ends of the opening in a first etching step;

transferring the rounding of the end caps to a length of top corners positioned along a periphery of the trenches in a second etching step.

3. The method of claim 2, wherein the step of forming a mask comprises the steps of:

forming a mask layer over the substrate, and reducing the mask layer to form the mask and the opening, opening exposing the substrate.

4. The method of claim 3, wherein the reduction of the mask layer is by anisotropically etching the mask layer over the opening.

5. The method of claim 2, wherein the step of forming rounded end caps comprises the steps of:

forming a cap layer over the mask and substrate, and reducing the cap layer to form the rounded end caps.

6. The method of claim 5, wherein the reduction of the cap layer is by blanket etching the cap layer.

7. The method of claim 4, wherein the step of transferring the rounding comprises the steps of:

etching the trench in the cap layer, and concurrent with the trench etching step, transferring the rounding of the end caps to the top corners of the trench.

8. The method of claim 7, wherein the etching of the trench is by plasma etch.

9. The method of claim 8, wherein the width of the opening is greater than the width of the trench.

10. The method of claim 2, wherein the distance between the end caps is about equal to the width of the trench.

* * * * *